United States Patent [19]

Single

[11] Patent Number: 4,602,168
[45] Date of Patent: Jul. 22, 1986

[54] LOW OFFSET CMOS COMPARATOR CIRCUIT

[75] Inventor: Peter S. Single, San Jose, Calif.

[73] Assignee: National Semiconductor Corporation, Santa Clara, Calif.

[21] Appl. No.: 594,070

[22] Filed: Mar. 28, 1984

[51] Int. Cl.⁴ .............................................. H03K 5/24
[52] U.S. Cl. .................................. 307/355; 307/299 B
[58] Field of Search ................... 307/299 B, 350, 355, 307/362, 356; 330/257

[56] References Cited

U.S. PATENT DOCUMENTS 4,429,234 1/1984 Streit ............................... 307/299 B Primary Examiner—John Zazworsky
Attorney, Agent, or Firm—Gail W. Woodward; Paul J. Winters

[57] ABSTRACT

A CMOS comparator circuit is disclosed in which a low offset is achieved without trimming. The input stage is composed of a pair of bipolar transistors which have lateral non-dedicated collectors that operate in parallel with the substrate dedicated collectors. The input stage includes matched load devices and is followed by an amplifier having a differential to single ended converter.

4 Claims, 2 Drawing Figures

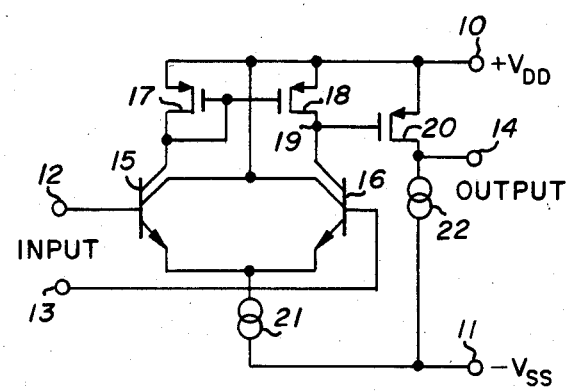
Fig_1
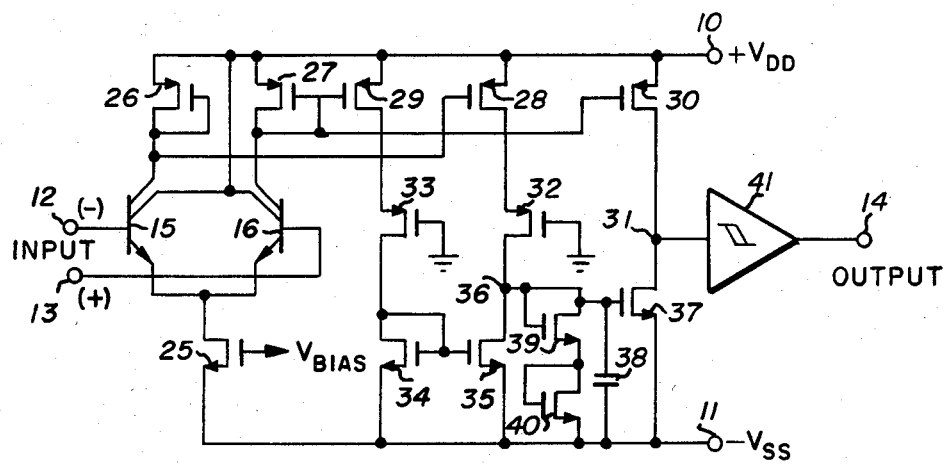
Fig_2

LOW OFFSET CMOS COMPARATOR CIRCUIT

BACKGROUND OF THE INVENTION

The invention relates to a comparator circuit wherein a substantially rail-to-rail digital signal is generated indicating the higher of two analog voltages. Thus, the circuit is an analog to digital converter. The circuit displays a so-called indeterminate range in its response wherein linear signal response occurs. Since the comparator ordinarily has high gain, the indeterminate range is small so that for reasonable drive signals a truly digital output is available. The invention is applicable to complementary metal oxide semiconductor (CMOS) circuits. In CMOS, P- and N-channel insulated gate field effect transistor (IGFET) construction is employed to create monopolar devices. In the so-called P-well construction the P-channel devices are created in the N- type semiconductor substrate wafer. N-channel devices are fabricated into P-type wells that are separately created in the substrate. It has long since been realized that such a construction form produces bipolar transistors that are often regarded as parasitic. The P-well acts as the transistor base and is reverse biased with respect to the substrate which is returned to the most positive potential applied to the circuit. If an N-channel IGFET source or drain electrode in the P-well if forward biased an NPN transistor exists with its collector dedicated to the substrate. Such transistors can be useful as emitter followers and are often employed in combination with IGFETS to create CMOS circuits. However, in many circuits it is desirable to employ a non-dedicated collector type of the bipolar transistor. A way of doing so is disclosed in a patent application of Thomas M. Fredericksen, et al., Ser. No. 956,953, filed Nov. 2, 1978, and now abandoned in favor of a continuation application Ser. No. 304,701, filed Sept. 22, 1981. The teaching in that application, which is titled "A Lateral Transistor Useful in CMOS Integrated Circuits", is incorporated herein, by reference. That application shows that if a bipolar transistor emitter in a CMOS P-well is closely associated with a laterally spaced collector, a double collector transistor is produced with one collector dedicated to the substrate and the other collector available for external circuitry. It is shown that even with the dedicated collector, substantial and useful transistor action occurs at the lateral collector. I have discovered that when a pair of such transistors are connected differentially the resulting differential amplifier can have a suprisingly low offset voltage without trimming or any other special measures. This is particularly true when the lateral collectors are returned to the substrate by way of a pair of matched P-channel load IGFETs.

In the prior art, there are two well known ways of making a CMOS comparator circuit. In one approach a pair of N-channel transistors are connected differentially and their gates provide the comparator input terminals. A pair of matched P-channel transistors are connected as a differential to single ended load by connecting their gates together and to the drain of one of the transistors with the other drain comprising the single ended output. This single ended output can then drive an amplifier stage to provide the comparator output. Such circuits typically have offsets in the range of 7 to 30 millivolts. In the other prior-art approach a sampled data comparator is made up of a high gain capacitor-coupled amplifier. The input capacitor is alternately switched between the two comparator inputs by clocked switches and the amplifier is alternately forced to its switch point by another clocked switch. The amplifier output operates a latch or a clocked Flip Flop. The circuit has its offset eliminated by the switching action but such circuits are very complex and difficult to analyze. They require complicated clocking which adds to the circuit complexity.

SUMMARY OF THE INVENTION

It is an object of the invention to create a comparator circuit in a CMOS structure wherein the input stage is comprised of a pair of differentially connected bipolar transistors having non-dedicated lateral collectors.

It is a further object of the invention to employ a bipolar transistor pair in a differential input stage on a CMOS chip and to couple a CMOS differential to single ended amplifier to the input stage to form a comparator having a low offset input determined largely by the bipolar devices.

These and other objects are obtained in a circuit configured as follows. The input stage is formed from a pair of NPN bipolar transistors coupled together as a differential amplifier in which the bases are the input terminals. These transistors are created from lateral collector structures fabricated in P-well bases. The non-dedicated collectors are returned to $V_{DD}$ by way of a pair of P-channel IGFETs which therefore provide a differential input stage output. These differential outputs are employed to drive current mirrors that are coupled together to produce a single ended signal node. The node is then employed to drive an output inverter which can swing nearly rail-to-rail when the input drive exceeds the indeterminate range of the circuit. If desired, the output can be coupled to a Schmitt trigger stage to ensure a clean substantially noise-free output.

BRIEF DESCRIPTION OF THE DRAWING

FIG. 1 is a schematic showing the fundamental elements of the invention.

FIG. 2 is a schematic diagram of a preferred embodiment of the invention.

DESCRIPTION OF THE INVENTION

With reference to FIG. 1 the circuit is operated from a power supply connected + (plus) to $V_{DD}$ terminal 10 and − (minus) to $V_{SS}$ terminal 11. Differential input terminals 12 and 13 produce a single ended output at terminal 14. Bipolar transistors 15 and 16 form the input stage and both have dual collectors. One collector in each input transistor is shown coupled directly to $+V_{DD}$ which represents the IC chip substrate. The other collector is returned to $+V_{DD}$ by way of P-channel transistors 17 and 18. These two IGFETs are coupled together to produce a differential to single ended output at node 19. This output is coupled to the gate of P channel transistor 20 which acts as a high gain inverter to drive output terminal 14. Constant current sinks 21 and 22 act respectively to supply the tail current for the differential input stage and the load device for transistor 20.

In the circuit of FIG. 2 a schematic diagram illustrates a preferred embodiment of the invention. The input stage is composed of a pair of bipolar transistors 15 and 16 as was the case in FIG. 1. The tail current is provided by transistor 25. However, the non-dedicated collectors provide a differential stage output by passing the collector currents through P-channel transistors 26 and 27 which are matched loads that have their gates returned to their drains.

Transistor 26 forms the input device in a current mirror with transistor 28. Transistor 27 forms the input device in two current mirrors with transistors 29 and 30. Transistor 30, acting as an inverter, drives output node 31. It can be seen that transistors 28 and 29 will be driven differentially and they work respectively into cascode load transistors 32 and 33 which have their gates grounded. Transistor 34, which has its gate returned to its drain, conducts the current flowing in transistors 29 and 33 so that it forms a current mirror with transistor 35. Thus circuit node 36 represents the single ended output point of the differential input. It is cascode isolated from the driver transistors so that the differential loading on the input stage is balanced. Node 36 then drives the gate of transistor 37 which, acting as an inverter, drives node 31. It can be seen that transistor 30 and 37 are driven differentially so that node 31 represents a single ended output fully isolated from the input stage. The differential drives cause input terminal 12 to be the inverting input and terminal 13 is the non-inverting input.

Transistors 39 and 40, and capacitor 38 form a delay network with matched response for positive and negative going transistions. The comparator will have indeterminate output with a gate to source voltage of approximately one N-channel threshold voltage on transistor 37. The gate to source voltage of transistor 37 has a maximum value of approximately two N-channel thresholds set by the transistors 39 and 40, and a minimum value of zero volts. Thus the one N-channel threshold, at which the comparator is in its indeterminate region, represents the middle of the range of possible voltages on the gate of transistor 37. The time taken for the comparator to reach its indeterminate region, or transistion point, is the time taken for capacitor 38 to charge to this point from the voltage at either extreme, the capacitor charge (or discharge) rate being set by the currents from transistors 35 and 32. As these currents are matched, and the voltages from the extreme value to the transition point are matched, these times will be equal. The value of 5 pF was chosen to allow rejection of fast noise spikes on the inputs, and has been found to be satisfactory.

EXAMPLE

The circuit of FIG. 2 has been implemented in a conventional P-well CMOS form of IC. The following IGFET sizes were employed.

| Device | W/L (microns) |
| --- | --- |
| 25 | 30/6 |
| 26, 27, 28, 20, 30, 34, 35, 37 | 20/20 |
| 32, 33, 39, 40 | 20/6 |

$V_{DD}$ and $V_{SS}$ were respectively +5 volts and −5 volts. The circuit was capable of switching the output within 3 microseconds of the input signal and had an input offset of less than 6 millivolts.

The invention has been described and a working example given. When a person skilled in the art reads the foregoing description, alternatives and equivalents, that are within the spirit and intent of the invention, will become apparent. Accordingly it is intended that the scope of the invention be limited only by the following claims.

I claim:

1. A CMOS comparator circuit having a single ended output terminal and first and second differential input terminals, said circuit comprising:
    an input stage comprising a pair of bipolar transistors, each one having an emitter, a base, a substrate dedicated collector, and a lateral collector adjacent to said emitter;
    means for coupling said input stage transistor bases to said comparator input terminals;
    means for coupling said pair of bipolar transistor emitters together and to a constant current sink to provide differential operation;
    matched transistor load means coupled to said lateral collectors of said pair of bipolar transistors; and
    amplifier means for coupling said matched transistor load means to said comparator output terminal.
2. The comparator circuit of claim 1 wherein said amplifier means includes a differential to single ended converter circuit.
3. The comparator circuit of claim 2 wherein said amplifier means further includes an amplifier stage having a cascode load coupled to drive said differential to single ended converter circuit.
4. The comparator circuit of claim 3 wherein said differential to single ended converter includes a P-channel transistor inverter and an N-channel transistor inverter and said N-channel transistor inverter includes time delay means.

* * * * *